United States Patent
Shany et al.

(10) Patent No.: US 7,036,071 B2
(45) Date of Patent: Apr. 25, 2006

(54) PRACTICAL CODING AND METRIC CALCULATION FOR THE LATTICE INTERFERED CHANNEL

(75) Inventors: Yaron Shany, Kfar Saba (IL); David Ben-Eli, Modiin (IL); Ilan Sutskover, Hadera (IL)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 10/214,630

(22) Filed: Aug. 7, 2002

(65) Prior Publication Data

US 2004/0030979 A1 Feb. 12, 2004

(51) Int. Cl.
*G06F 11/00* (2006.01)
*H03M 13/00* (2006.01)

(52) U.S. Cl. ...................... 714/810; 714/755
(58) Field of Classification Search ............. 714/752, 714/758, 786, 746, 810, 755, 792; 375/286, 375/341, 292
See application file for complete search history.

(56) References Cited

U.S. PATENT DOCUMENTS

| | | | | |
|---|---|---|---|---|
| 4,933,956 A | * | 6/1990 | Forney, Jr. | 375/341 |
| 5,297,170 A | * | 3/1994 | Eyuboglu et al. | 375/242 |
| 5,388,124 A | * | 2/1995 | Laroia et al. | 375/286 |

OTHER PUBLICATIONS

Wang et al., Leech lattice coding and modulation for IEEE 802.11A WLAN, 2001, IEEE, p. 38-42.*
Be'ery et al., Fast decoding of the leech lattice, Aug. 1989, IEEE Journal on Selected areas in Comm. vol. 7, No. 6, p. 956-966.*
Erez, U , et al., "Capacity and Lattice-Strategies for Canceling Known Interference", *Proceedings of ISITA 2000, Honolulu, Hawaii,* (Nov. 2000), 681-684.
Forney Jr., G D., et al., "Sphere-bound-achieving coset codes and multilevel coset codes", *IEEE Transactions on Information Theory, 46(3),* (May 2000), 820-850.

* cited by examiner

*Primary Examiner*—Shelly Chase
(74) *Attorney, Agent, or Firm*—Schwegman, Lundberg, Woessner & Kluth, P.A.

(57) ABSTRACT

A communication system includes a lattice interfered channel to transmit data from a transmitter to a receiver. In one embodiment, an encoding-modulation scheme having a rich signal constellation is used to encode data at a total rate of 0.7 bit/dimension or less before transmission into the lattice interfered channel. In another embodiment, decoding metric approximation techniques are used to process signals received from the lattice interfered channel. In still another embodiment, multilevel code (MLC) decoding is used to jointly decode an error correction code component and a lattice/MLC component of a received signal. The error correction code component may then be extracted from the decoded signal.

32 Claims, 3 Drawing Sheets

PRACTICAL CODING AND METRIC CALCULATION FOR THE LATTICE INTERFERED CHANNEL

BACKGROUND OF THE INVENTION

A lattice interfered channel is a channel that includes the addition of one or more lattice vectors. Such a channel may be obtained in a communication system when a transmitter and/or receiver in the system performs the modulo lattice operation on a corresponding communication signal. In one known application, for example, a modulo lattice operation is performed within a transmitter as part of an interference cancellation scheme to cancel known interference in a corresponding communication channel (see, e.g., "Capacity and Lattice-Strategies for Canceling Known Interference," by Erez et al., *Proc. 2000 Int. Symp. Inform. Theory Appl.*, Honolulu, Hi., November 2000). The modulo lattice operation has also been used within multistage decoders for decoding multilevel codes. One such use is described in the paper "Sphere-Bound-Achieving Coset Codes and Multilevel Coset Codes," by Forney, Jr., et al., *IEEE Transactions on Information Theory*, vol. 46, no. 3, pp. 820–850, May 2000. Other applications involving lattice interfered channels also exist. Thus, there is a general need for practical techniques and structures for effectively implementing systems having a lattice interfered channel.

DETAILED DESCRIPTION

Figure 1:
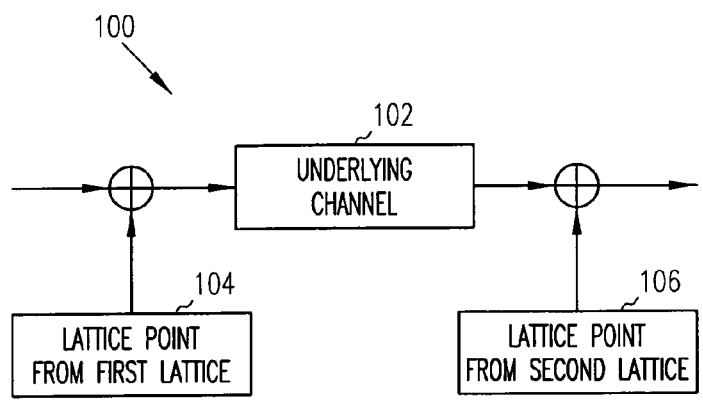
FIG. 1 is a block diagram illustrating a lattice interfered channel in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating a lattice interfered channel 100. The lattice interfered channel 100 is a channel having an arbitrary underlying channel 102 (which may include, for example, an additive white Gaussian noise channel, etc.) with the addition of at least one lattice vector 104, 106 at the input and/or output of the underlying channel 102. The lattice vector(s) added at the underlying channel input and/or output may possibly come from different lattices, but are often related to the same lattice.

Figure 2:
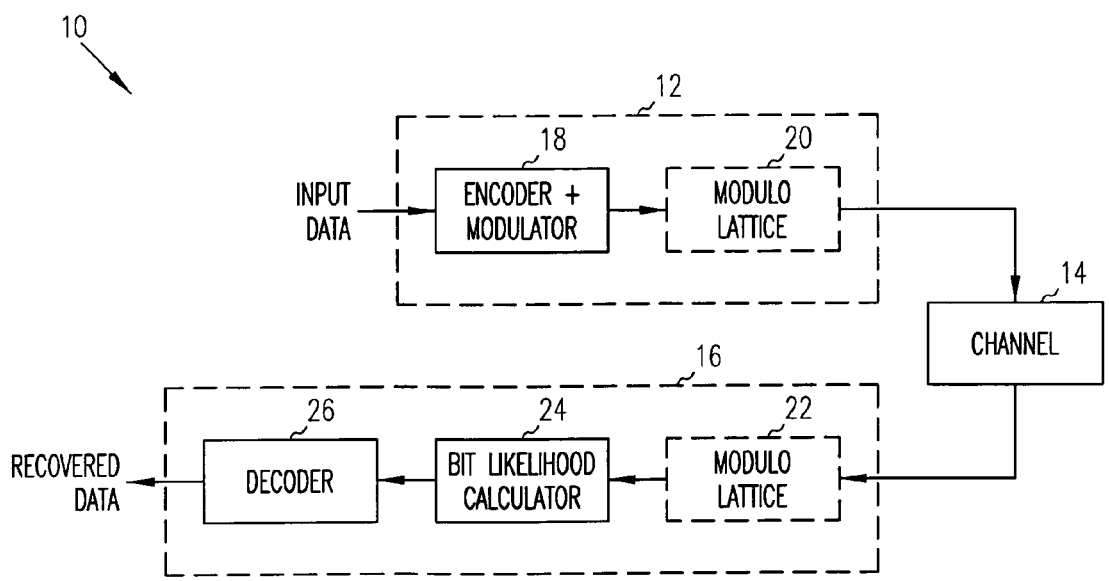
FIG. 2 is a block diagram illustrating an example of a communication system having a lattice interfered channel in accordance with an embodiment of the present invention.

FIG. 2 is a block diagram illustrating a communication system 10 in accordance with an embodiment of the present invention. As illustrated, the communication system 10 includes: a transmitter 12, a communication channel 14, and a receiver 16. The transmitter 12 receives input data which it uses to generate a transmit signal that is then delivered to the communication channel 14. The transmit signal propagates through the communication channel 14 to the input of the receiver 16. The receiver 16 then processes the received signal to recover the original data. As illustrated, either the transmitter 12, the receiver 16, or both the transmitter 12 and the receiver 16, include a modulo lattice unit 20, 22 for performing a modulo lattice operation on a corresponding signal. The combination of the modulo lattice unit (or units) and the communication channel 14 (i.e., the underlying channel) form a lattice interfered channel in the system 10. Note that there are other possible realizations for a lattice interfered channel apart from the one illustrated in the system 10 of FIG. 2.

A lattice is a discrete infinite collection of points (or vectors) that is created by the repetition of a base or unit cell throughout space. A lattice must satisfy several rules; namely, it is closed under addition, it contains an inverse element for each lattice element, it contains the zero element (i.e., the origin of the coordinate axes is a point of the lattice), and it is discrete. For a given lattice and a given input vector, the modulo lattice operation first finds a point in the lattice that is closest to the input vector and then determines the difference between that point and the input vector. More specifically, let $\bar{v}$ be a real vector in n space (i.e., $\bar{v} \in R^n$) and let $\Lambda \subset R^n$ be a lattice. The reduction of $\bar{v}$ modulo $\Lambda$ (denoted by $\mathrm{mod}_\Lambda(\bar{v})$) is then calculated in two stages: (1) a vector $\bar{\lambda} \in \Lambda$ is first found that is closest to $\bar{v}$, and (2) the vector $\bar{\lambda}$ is substracted from $\bar{v}$ to generate the output of the modulo operation. For example, if $\Lambda = Z$ is the integer lattice, then $\mathrm{mod}_\Lambda(1.4) = 1.4 - 1 = 0.4$ and $\mathrm{mod}_\Lambda(38.7) = 38.7 - 39 = -0.3$. Similarly, if $\Lambda$ is the two-dimensional hexagonal lattice, (i.e., $\Lambda = \{i \cdot (1,0) + j \cdot (1/2, \sqrt{3}/2) | i, j \text{ integers}\}$), then:

$\mathrm{mod}_\Lambda((0.1, 0.1)) = (0.1, 0.1) - (0,0) = (0.1, 0.1)$ and $\mathrm{mod}_\Lambda(0.55, 0.8) = (0.55, 0.8) - (0.5, 0.8660254) = (0.05, -0.0660254)$.

As described above, a modulo lattice operation may be performed within a communication system for a variety of different reasons.

In addition to the optional modulo lattice unit 20, the transmitter 12 includes an encoder-modulator 18 to encode and modulate the input data in a predetermined manner for transmission into the channel 14. The encoding and modulation may be performed jointly by the encoder-modulator 18 as part of a single integrated mapping or the encoding and modulation may be performed separately (e.g., by separate encoder and modulator units within the encoder-modulator 18). The encoded and modulated data is delivered to the modulo lattice unit 20 (if present) which performs the modulo lattice operation on the signal. Although not shown in FIG. 2, the modulo lattice operation may be performed as part of a more complex processing function (e.g., the interference cancellation scheme of Erez et al. identified above, etc.). The resulting signal is delivered to the channel 14 for transmission to the receiver 16. Additional processing functionality (not shown) may also be present within the transmitter 12. For example, in a wireless implementation, radio frequency (RF) processing functionality (e.g., a frequency converter, an RF power amplifier, etc.) will typically be provided within the transmitter 12.

In the communication channel 14, the transmitted signal may be acted upon by additive noise. For example, in at least one embodiment, additive white Gaussian noise (AWGN) is present in the channel 14. Channel types other than additive noise channels may also be used in accordance with the present invention. Certain forms of signal distortion (e.g., inter-symbol interference or ISI) may also occur in the channel 14. This noise and distortion may modify the transmitted signal in a manner that makes it more difficult to recover the original data within the receiver 16.

As described above, the receiver 16 may include a modulo lattice unit 22 to perform a modulo lattice operation on a received signal. As in the transmitter 12, this modulo lattice operation may be performed as part of a more complex processing function (e.g., as part of a multistage decoding scheme, etc.). In addition, the receiver 16 may include a bit likelihood calculator 24 and a decoder 26. The bit likelihood calculator 24 calculates, based on the signal received from the channel and the channel statistics, the likelihoods that particular bit values were transmitted by the transmitter 12. These bit likelihoods are then delivered to the decoder 26 for use in decoding the received signal to recover the original data. In one approach, the bit likelihood calculator 24 determines the following probability vector for delivery to the decoder 26:

$$(P(b_1=0|\bar{y}), P(b_2=0|\bar{y}), \ldots, P(b_k=0|\bar{y}))$$

where $\bar{y}$ is the signal received from the lattice interfered channel, k is the number of bits associated with a transmitted symbol, and $b_1, b_2, \ldots, b_k$ represent the coded bits (possibly corresponding to several component codes). Other forms of likelihood information may alternatively be developed by the bit likelihood calculator 24 including, for example, likelihood ratios, log likelihood ratios (LLRs), probability differences, and others. Like the transmitter 12, the receiver 16 may include other functionality that is not illustrated in the figure. For example, in a wireless system, RF processing functionality (e.g., a low noise amplifier, filters, a frequency converter, etc.) may be provided within the receiver 16. The decoder 26 may include any form of decoder that uses predetermined bit likelihood information during the decoding process.

In accordance with one aspect of the present invention, the encoder-modulator 18 within the transmitter 12 uses a rich constellation in the process of encoding and modulating the input data for transmission into the lattice interfered channel. A rich constellation is a constellation in n-space ($R^n$) that contains more than $2^n$ signal points. Examples of signaling schemes in two dimensions that use a rich constellation include 16-QAM (quadrature amplitude modulation) and 8-PSK (phase shift keying). It was determined that increased capacity can be achieved in a lattice interfered channel by utilizing a rich constellation to encode and modulate the data to be transmitted through the channel, even at low rates (e.g., rates of 0.7 bits/dimension or less). This is in contrast to non lattice interfered channels (e.g., a conventional AWGN channel, etc.) that typically achieve little or no improvement in capacity with the use of a rich constellation at low rates. As used herein, the term "rate" refers to the total rate resulting from the code rate and the corresponding signal constellation.

In accordance with another aspect of the present invention, reduced computational complexity is achieved within a receiver in a system having a lattice interfered channel by approximating the corresponding bit likelihoods developed in the receiver (e.g., within the bit likelihood calculator 24 of FIG. 2). In a non-approximated approach, infinite sums need to be calculated to determine the bit likelihoods based on a received signal. It was determined that a relatively accurate approximation of the bit likelihoods could be achieved by instead calculating a truncated sum over an appropriate portion of a corresponding lattice. In at least one embodiment, for example, a number of sets $M_i(\Lambda)(i \geq 0)$ are defined that each include the ith smallest norm points of a lattice $\Lambda$. The set $M_0(\Lambda)$ thus includes the zero vector as its only element. The set $M_1(\Lambda)$ includes all of the first smallest norm points in the lattice $\Lambda$ (other than the zero vector), the set $M_2(\Lambda)$ includes the second smallest norm points in the lattice $\Lambda$, and so on. The sets $M_i(\Lambda)$ will be referred to herein as the "tiers" of the lattice $\Lambda$. The constellation that is used in the process of encoding and modulating the input data will be represented as $\Omega$ herein. For each possible bit position l in a transmitted symbol, a set $\Omega_o(l)$ may be defined as the set of constellation points having zero in the lth bit position ($1 \leq l \leq k$).

To approximate the bit likelihoods, a decoding accuracy may first be selected. In one approach, for example, this involves the selection of the number of tiers t+1 of the lattice $\Lambda$ that will be used in the decoding process. A higher number of tiers will often result in a more accurate approximation, but will involve a higher computational complexity. Likewise, a smaller number of tiers may lead to a less accurate approximation, but will involve less computational complexity. In one approach, the lowest number of tiers is selected that will provide a desired decoding performance level. Once the number of tiers has been selected, a set $T(\Lambda)$ is defined as the set including all relevant tiers (i.e., $T(\Lambda) = M_0(\Lambda) \cup M_1(\Lambda) \cup \ldots \cup M_t(\Lambda)$). Thus, the set $T(\Lambda)$ will include all lattice points having a norm that is less than or equal to a predetermined value (this predetermined norm being the norm of points within $M_t(\Lambda)$).

If the receiver 16 does not include a modulo lattice unit 22 at its input, the bit likelihood calculator 24 will first reduce the received signal $\bar{y}$ modulo $\Lambda$. The output of this operation is defined as $\tilde{y}=\bar{y}-\hat{\lambda}$, where $\bar{y}$ is the signal received from the channel 14 and $\hat{\lambda}$ is the closest lattice point to $\bar{y}$. If the modulo lattice unit 22 is present, this operation is not necessary in the bit likelihood calculator 24, and the operation is written simply $\tilde{y}=\bar{y}$. The approximated bit likelihoods may then be approximated as follows:

$$P(b_l = 0 \mid \bar{y}) \cong \frac{\sum_{\bar{s} \in \Omega_0(l)} \sum_{\bar{\lambda} \in T(\Lambda)} P(\tilde{y} + \bar{\lambda} \mid \bar{S} = \bar{s}) P(\bar{\lambda} \mid \bar{S} = \bar{s}) P(\bar{S} = \bar{s})}{\sum_{\bar{s} \in \Omega} \sum_{\bar{\lambda} \in T(\Lambda)} P(\tilde{y} + \bar{\lambda} \mid \bar{S} = \bar{s}) P(\bar{\lambda} \mid \bar{S} = \bar{s}) P(\bar{S} = \bar{s})}$$

where $\bar{S}$ is the (random) transmitted symbol and $P(\bar{y}'|\bar{S}=\bar{s})$ is determined from the channel statistics. For an AWGN channel, for example, the probability $P(\bar{y}'|\bar{S}=\bar{s})$ is calculated as follows:

$$P(\bar{y}' \mid \bar{S} = \bar{s}) = \frac{1}{\left(\sqrt{2\pi\sigma^2}\right)^n} \exp\left\{-\frac{1}{2\sigma^2} \sum_{j=1}^{n} (y'_i - s_i)^2\right\}$$

where $\sigma^2$ is the noise variance, $\bar{y}'=(y'_1, y'_2, \ldots, y'_n)$ is any real vector, and $\bar{s}=(s_1, s_2, \ldots, s_n)$. In many applications, both $P(\bar{\lambda}|\bar{S}=\bar{s})$ and $P(\bar{S}=\bar{s})$ may be eliminated from the numerator and denominator as they are not dependent on the specific value of $\bar{s}$ and $\bar{\lambda}$. Thus, in these applications, the approximated likelihood expression reduces to:

$$P(b_l = 0 \mid \bar{y}) \cong \frac{\sum_{\bar{s} \in \Omega_0(l)} \sum_{\bar{\lambda} \in T(\Lambda)} P(\bar{y} + \bar{\lambda} \mid \bar{S} = \bar{s})}{\sum_{\bar{s} \in \Omega} \sum_{\bar{\lambda} \in T(\Lambda)} P(\bar{y} + \bar{\lambda} \mid \bar{S} = \bar{s})}$$

The above approximated likelihoods may be calculated for each bit position l associated with the transmitted symbol. The resulting likelihood values may then be delivered to the decoder 26 for use in recovering the original data.

Using the above-described equations, approximations maybe determined for bit likelihoods having the form $P(b_l=0|\bar{y})$, $1 \leq l \leq k$. In an equivalent manner, approximations can be developed for other forms of likelihood information including, for example, likelihood ratios $P(b_l=0|\bar{y})/Pr(b_l=1|\bar{y})$, log-likelihood ratios (LLR), likelihood differences, and/or similar likelihood measures. The type of likelihood information that is developed will often depend on the specific decoding method being implemented.

An example of the above-described metric approximation technique follows for a signaling scheme having the symbol constellation $\Omega=\{-3,-1,1,3\}$ (i.e., 4-PAM). Assume that pairs of input bits are mapped to constellation points in a transmitter as follows: $00 \mapsto -3, 01 \mapsto -1, 11 \mapsto 1, 10 \mapsto 3$ (i.e., Gray mapping). Suppose also that the transmitter adds a large dither signal to the transmit symbol and then reduces the result modulo lattice $\Lambda$ consisting of all integers divisible by 5 (i.e., $\Lambda=\{5 \cdot i | i \text{ integer}\}=5Z$). Now suppose that the channel output is y=8.23 and the receiver does not include a modulo lattice unit 22. Then, the non-approximated value of $P(b_1=0|y)$ (where $b_1$ is the first of the two bits that determine the constellation point) is:

$$P(b_1 = 0 \mid y) = \frac{\sum_{s \in \{-3,-1\}} \sum_{\lambda \in 5Z} P(8.23 + \lambda \mid S = s) P(\lambda \mid S = s) P(S = s)}{\sum_{s \in \{-3,-1,1,3\}} \sum_{\lambda \in 5Z} P(8.23 + \lambda \mid S = s) P(\lambda \mid S = s) P(S = s)}$$

where S is the random transmitted symbol, p(y'|S=s) is determined from the channel statistics, and $\{-3,-1\}$ are the symbols with zero in the first bit. Note that the second summation in both the numerator and the denominator is performed over the entire lattice $\Lambda=5Z$ (i.e., they are infinite sums). When the dither signal is strong and independent of the transmitted symbol S, then $P(\lambda|S=s)$ is not a function of $\lambda$ or s. Also, when S is uniformly distributed over its sample space, then $P(S=s)$ is not a function of s. In this case, the non-approximated value of $P(b_1=0|y)$ becomes:

$$P(b_1 = 0 \mid y) = \frac{\sum_{s \in \{-3,-1\}} \sum_{\lambda \in 5Z} P(8.23 + \lambda \mid S = s)}{\sum_{s \in \{-3,-1,1,3\}} \sum_{\lambda \in 5Z} P(8.23 + \lambda \mid S = s)}.$$

To reduce the complexity of the calculation, y is replaced by $\mathrm{mod}_\Lambda(y)$ and the sums are calculated over all lattice points $\lambda$ with $|\lambda| \leq \rho$, for some predetermined number $\rho$ (e.g., all tiers having norms less than or equal to $\rho$). Since y=8.23, $\hat{\lambda}=10$ and $\mathrm{mod}_\Lambda(y)=8.23-10=-1.77$. If $\rho=15$, for example, then the approximate likelihoods corresponding to the above two equations are, respectively:

$$P(b_1 = 0 \mid y) \cong$$

$$\frac{\sum_{s \in \{-3,-1\}} \sum_{\lambda \in \{0, \pm 5, \pm 10, \pm 15\}} p(-1.77 + \lambda \mid S = s) P(\lambda \mid S = s) P(S = s)}{\sum_{s \in \{-3,-1,1,3\}} \sum_{\lambda \in \{0, \pm 5, \pm 10, \pm 15\}} p(-1.77 + \lambda \mid S = s) P(\lambda \mid S = s) P(S = s)}$$

and $$P(b_1 = 0 \mid y) \cong \frac{\sum_{s \in \{-3,-1\}} \sum_{\lambda \in \{0, \pm 5, \pm 10, \pm 15\}} p(-1.77 + \lambda \mid S = s)}{\sum_{s \in \{-3,-1,1,3\}} \sum_{\lambda \in \{0, \pm 5, \pm 10, \pm 15\}} p(-1.77 + \lambda \mid S = s)}.$$

By replacing each summation over $s \in \{-3,-1\}$ by a summation over $s \in \{-3,3\}$ in the above expressions, the corresponding expressions for $P(b_2=0|y)$ may be obtained, where $b_2$ is the second of the two bits that determine the constellation point.

Figure 3:
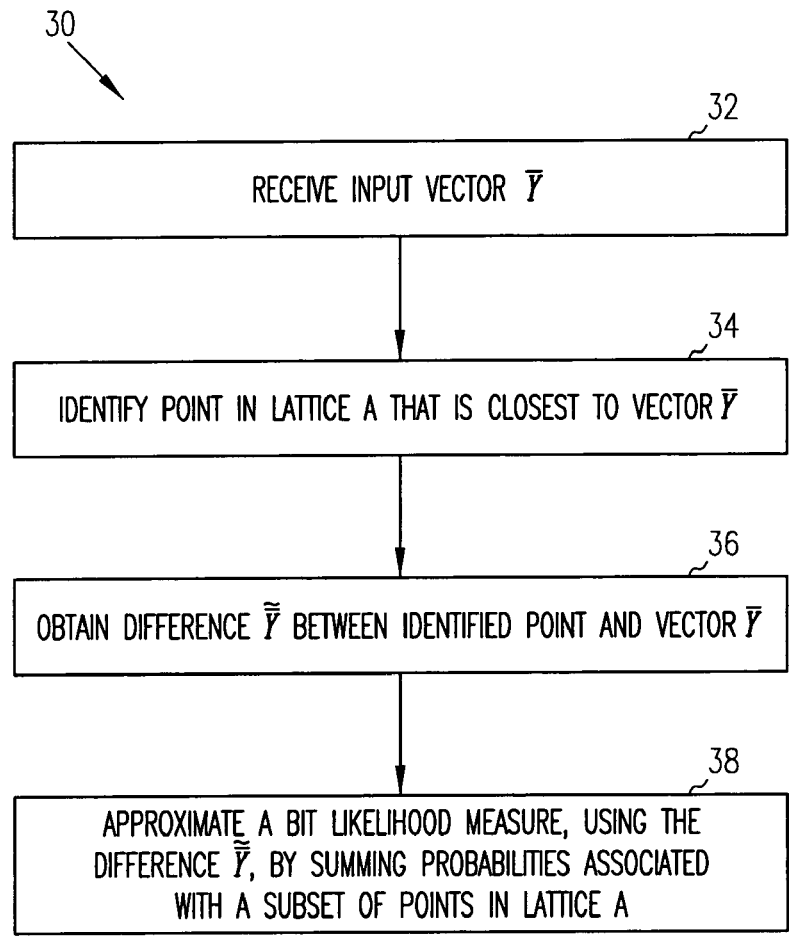
FIG. 3 is a flowchart illustrating a method for processing a signal in a communication system having a lattice interfered channel in accordance with an embodiment of the present invention.

FIG. 3 is a flowchart illustrating a method 30 for processing a received signal in a communication system having a lattice interfered channel. An input vector $\bar{y}$ is first received (block 32). A point is then identified within a lattice $\Lambda$ (i.e., a lattice associated with the lattice interfered channel) that is closest to the received vector $\bar{y}$ (block 34). A difference $\tilde{y}$ is next obtained between the identified point and the vector $\bar{y}$ (block 36). If the lattice interfered channel includes a modulo lattice operation at the input of the receiver, the identification of the closest point and the determination of the difference between the point and the received signal is already performed as part of the modulo lattice operation and we write $\tilde{y}$ for $\bar{y}$ itself. Otherwise, the above acts are performed on the signal output by the lattice interfered channel. A bit likelihood measure (e.g., $P(b_1=0|\bar{y})$) is next approximated using the difference $\tilde{y}$ determined above (block 38). This approximation includes summing together probabilities associated with a subset of points within the lattice $\Lambda$. In one approach, the subset of points within the lattice $\Lambda$ includes all points of the lattice having a norm no greater than a predetermined value $\rho$. The probabilities that are summed together may include, for example, the probability product $P(\tilde{y}+\bar{\lambda}|\bar{S}=\bar{s})P(\bar{\lambda}|\bar{S}=\bar{s})P(\bar{S}=\bar{s})$ described above, for each point $\bar{s}$ within an appropriate subset of constellation points, and for each point $\bar{\lambda}$ within the appropriate finite subset of $\Lambda$. This summation would need to be determined, for example, during calculation of the approximated bit likelihood:

$$P(b_l=0\mid \bar{y}) \cong \frac{\sum_{\bar{s}\in\Omega_0(l)}\sum_{\bar{\lambda}\in T(\Lambda)} P(\tilde{y}+\bar{\lambda}\mid \bar{S}=\bar{s})P(\bar{\lambda}\mid \bar{S}=\bar{s})P(\bar{S}=\bar{s})}{\sum_{\bar{s}\in\Omega}\sum_{\bar{\lambda}\in T(\Lambda)} P(\tilde{y}+\bar{\lambda}\mid \bar{S}=\bar{s})P(\bar{\lambda}\mid \bar{S}=\bar{s})P(\bar{S}=\bar{s})}.$$

Similarly, the probability $P(\tilde{y}+\bar{\lambda}\mid \bar{S}=\bar{s})$ may be summed over the appropriate subsets of lattice and constellation points. This summation would need to be determined, for example, during calculation of the approximated bit likelihood:

$$P(b_l=0\mid \bar{y}) \cong \frac{\sum_{\bar{s}\in\Omega_0(l)}\sum_{\bar{\lambda}\in T(\Lambda)} P(\tilde{y}+\bar{\lambda}\mid \bar{S}=\bar{s})}{\sum_{\bar{s}\in\Omega}\sum_{\bar{\lambda}\in T(\Lambda)} P(\tilde{y}+\bar{\lambda}\mid \bar{S}=\bar{s})}$$

As will be appreciated, other approximated bit likelihood measures may also require calculation of the above identified summations (e.g., likelihood ratios, log likelihood ratios, etc.).

Figure 4:
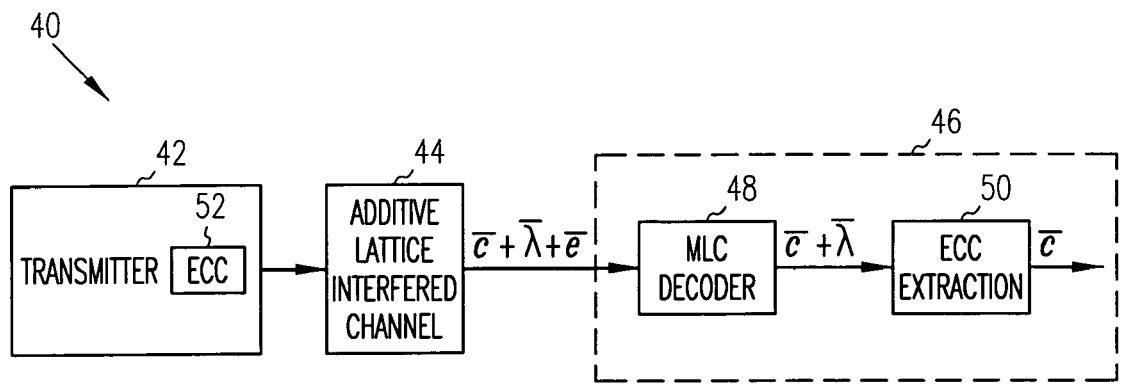
FIG. 4 is a block diagram illustrating a communication system having a lattice interfered channel in accordance with another embodiment of the present invention.

FIG. 4 is a block diagram illustrating a communication system 40 in accordance with an embodiment of the present invention. As illustrated, the communication system 40 includes: a transmitter 42, an additive lattice interfered channel 44, and a receiver 46. The additive lattice interfered channel 44 is comprised of an underlying additive noise channel (which, for example, can include the additive white Gaussian noise channel) together with addition of lattice vectors at the input and/or output of the underlying channel. The lattice vectors possibly added at the input and output of the underlying channel may come from different lattices, but are usually from the same lattice. The receiver 46 includes a multilevel code (MLC) decoder 48 and an ECC extraction unit 50. The transmitter 42 includes, among other things, an error correction coder (ECC) 52 to encode input data using an error correction code. In one approach, the error correction code has the form:

$$C=C_1+2C_2+4C_3+\ldots+2^{j-1}C_j$$

where $C_i$ are binary codes (that may or may not be nested). Such a code may exist when, for example, the ECC is constructed of j independent codes. This code format may also result when a single length n·j code is tiled (e.g., after interleaving) to j tiles of length n, where the individual tiles are denoted by $C_i$; $i\in\{1,2,\ldots,j\}$. Each codeword output by the ECC 52 is delivered to the additive lattice interfered channel 44 for transmission to the receiver 46. Each word received by the receiver 46 will thus have the form:

$$\bar{y}=\bar{c}+\bar{e}+\bar{\lambda}$$

where $\bar{c}$ is the transmitted ECC codeword, $\bar{e}$ is the additive interference, and $\bar{\lambda}$ is a lattice translation. This same received word format will also result if the above-described error correction code is added to a lattice code or a multi-level code (MLC) having the form:

$$\Lambda=\alpha(2^j C_{j+1}+\ldots+2^{k-1}C_k+2^k Z^n)$$

where $2^k Z^n$ is the translation term, Z is the set of integers, and $\alpha\geq 1$ (in the special case where $\alpha=1$, the total induced MLC is actually a multilevel coset code). The receiver 46 is operative for, among other things, inferring the transmitted ECC codeword $\bar{c}$ based on the received word $\bar{y}$.

Initially, the receiver 46 views the received word $\bar{y}$ as the sum of a multilevel code point (i.e., $\bar{c}+\bar{\lambda}$) and additive interference (i.e., $\bar{e}$). The MLC decoder 48 jointly decodes $\bar{c}$ and $\bar{\lambda}$ from the received word $\bar{y}$ and outputs the resulting MLC point $\bar{c}+\bar{\lambda}$. The MLC decoder 48 may use any known MLC decoding technique to perform the joint decoding. The ECC extraction unit 50 receives the decoded MLC code point from the MLC decoder 48 and processes the information to extract the ECC codeword $\bar{c}$. Since the mapping of $\bar{c}$ and $\bar{\lambda}$ to the MLC point $\bar{c}+\bar{\lambda}$ is typically a bijective function, $\bar{c}$ and $\bar{\lambda}$ may be easily recovered when $\bar{c}+\bar{\lambda}$ is known. For example, for the code formulation described above, $\bar{c}$ and $\bar{\lambda}$ will correspond to specific coordinates of the binary expansion of $\bar{c}+\bar{\lambda}$ (i.e., the first coordinates of the binary expansion will correspond to $\bar{c}$ and the remaining coordinates will correspond to $\bar{\lambda}$). Thus, the codeword $\bar{c}$ may be recovered by appropriately selecting the coordinates of the expansion. Once the ECC codeword $\bar{c}$ has been extracted, the error correction coding may be removed to recover the original data word.

Figure 5:
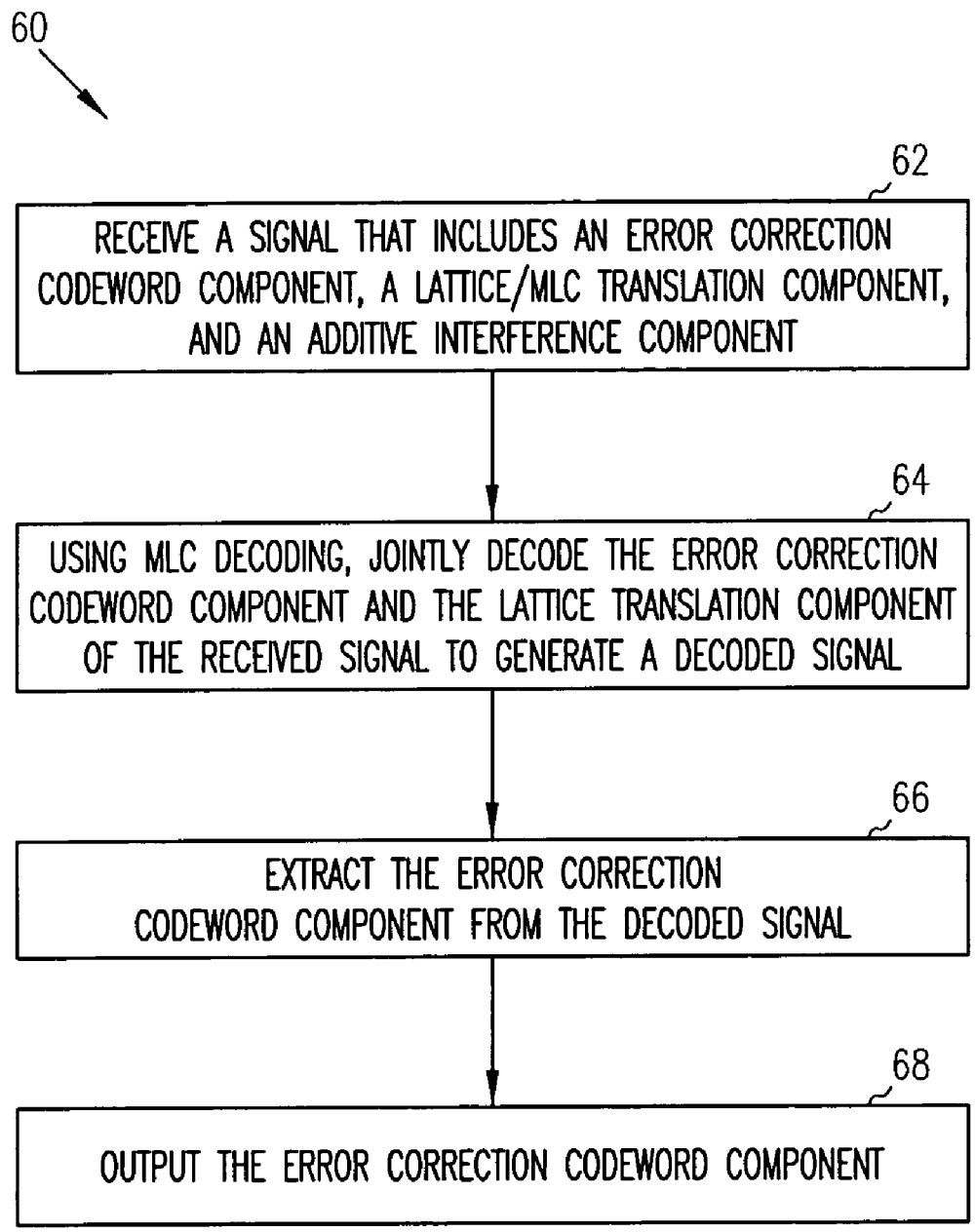
FIG. 5 is a flowchart illustrating a method for processing a signal having an error correction codeword component and a lattice/Multilevel Code (MLC) translation component in accordance with an embodiment of the present invention.

FIG. 5 is a flowchart illustrating a method 60 for processing a communication signal in accordance with an embodiment of the present invention. A signal is received that includes an error correction codeword component, a lattice/MLC translation component, and an additive interference component (block 62). The error correction codeword component and the lattice/MLC translation component of the signal are viewed collectively as a single codeword of a multilevel code. Such a signal may be formed, for example, by the passage of an ECC codeword through an additive lattice interfered channel or by the simple addition of a lattice code or multilevel code to a corresponding error correction code. Using MLC decoding techniques, the error correction codeword component and the lattice/MLC translation component of the signal are jointly decoded (block 64). The error correction codeword component of the signal is then extracted from the decoded signal (block 66). The extraction may include, for example, determining a binary expansion of the decoded signal and then selecting coordinates of the expansion that correspond to the error correction codeword component. Other extraction techniques may alternatively be used. Furthermore, the output of the extraction unit need not necessarily be comprised of hard bit values, and soft outputs for the error correction codeword component are allowed. The error correction codeword component may then be output for further processing (block 68).

The above-described techniques for recovering an ECC codeword maybe used whenever an ECC and a corresponding lattice/MLC type code (e.g., associated with a lattice interfered channel) can be viewed collectively as a single multilevel code. In at least one approach, an ECC is selected for a communication system (e.g., a system having an additive lattice interfered channel) so that the above described techniques can be implemented in a receiver of the system. Using the above-described techniques, maximum a-posteriori decoding may be approximated with relatively low complexity. An additional reduction in complexity may be achieved by performing the joint decoding of the ECC and lattice/MLC using iterative decoding techniques. In at least one implementation, the previously described bit likelihood approximation techniques are used during the joint decoding of the ECC and lattice/MLC. However, as described above, any known method of performing MLC decoding may be used. It should be appreciated that the codes C and Λ do not have to be made up of binary constituent codes to perform the above-described techniques. That is, any small alphabet size may be used.

Minimum probability of error may be achieved when the decisions correspond to $$P(\overline{c}\mid\overline{y}) = \sum_{\overline{\lambda}} P(\overline{c},\overline{\lambda}\mid\overline{y}).$$

In at least one approach, decoding is simplified by approximating this term using $\max_{\overline{\lambda}} P(\overline{c},\overline{\lambda}|\overline{y})$. This is because the evaluation of $\max_{\overline{c}}\max_{\overline{\lambda}} P(\overline{c},\overline{\lambda}|\overline{y}) = \max_{\{\overline{c},\overline{\lambda}\}} P(\overline{c},\overline{\lambda}|\overline{y})$ is significantly less complex than the evaluation of $$\max_{\overline{c}} P(\overline{c}\mid\overline{y}) = \max_{\overline{c}} \sum_{\overline{\lambda}} P(\overline{c},\overline{\lambda}\mid\overline{y}).$$

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A communication system comprising:
   an encoder-modulator to map input data into a signal constellation having more than $2^k$ signal points in k dimensions; and
   a lattice interfered channel having an underlying channel together with at least one of the following: addition of at least one lattice vector at an input of the underlying channel and addition of at least one lattice vector at an output of the underlying channel,
   wherein said mapped input data is transmitted through said lattice interfered channel at a rate of no greater than 0.7 bits/dimension.

2. The communication system of claim 1, wherein:
   said encoder-modulator includes a separate modulator and a separate encoder.

3. The communication system of claim 1, wherein:
   said encoder-modulator maps said input data into said signal constellation as part of a single integrated mapping.

4. The communication system of claim 1, wherein:
   said lattice interfered channel includes a modulo lattice unit to perform a modulo lattice operation on said mapped input data before said mapped input data reaches said underlying channel.

5. The communication system of claim 1, wherein:
   said lattice interfered channel includes a modulo lattice unit to perform a modulo lattice operation on output data of said underlying channel.

6. A transmitter comprising:
   an encoder-modulator to map input data into a k-dimensional signal constellation having greater than $2^k$ signal points at a rate of no more than 0.7 bits/dimension; and
   a modulo lattice unit to perform a modulo lattice operation on the mapped input data.

7. The transmitter of claim 6, wherein:
   said encoder-modulator includes a separate modulator and a separate encoder.

8. The transmitter of claim 6, wherein:
   said encoder-modulator maps said input data into said signal constellation as part of a single integrated mapping.

9. A method for transmitting data in a communication system, comprising:
   encoding and modulating data according to a signaling scheme having a rich constellation to generate a communication signal; and
   transmitting said communication signal into a lattice interfered channel at a rate of no more than 0.7 bits/dimension.

10. The method of claim 9, wherein:
    said lattice interfered channel includes an underlying channel and a modulo lattice unit to perform a modulo lattice operation on a signal flowing toward said underlying channel.

11. The method of claim 9, wherein:
    said lattice interfered channel includes an underlying channel and a modulo lattice unit to perform a modulo lattice operation on a signal flowing out of said underlying channel.

12. The method of claim 9, wherein:
    said lattice interfered channel includes an underlying channel, a first modulo lattice unit to perform a modulo lattice operation on a signal flowing toward said underlying channel, and a second modulo lattice unit to perform a modulo lattice operation on a signal flowing out of said underlying channel.

13. A method for use in processing a received signal in a communication system having a lattice interfered channel, said lattice interfered channel having an associated lattice $\Lambda$, comprising:
    identifying a point in the lattice $\Lambda$ that is closest to a received vector;
    obtaining a difference between the identified point and the received vector; and
    approximating a bit likelihood measure using the difference between the identified point and the received vector, wherein approximating includes calculating a sum of probabilities associated with a subset of lattice points within lattice $\Lambda$,
    wherein prior to transmission, input data is mapped into a signal constellation having more than $2^k$ signal points in k dimensions for transmission through the lattice interfered channel at a rate of no greater than 0.7 bits/dimension.

14. The method of claim 13, wherein:
    said subset of lattice points includes points within $\Lambda$ having a norm no greater than a predetermined value $\rho$.

15. A method for use in processing a received signal in a communication system having a lattice interfered channel, said lattice interfered channel having an associated lattice $\Lambda$, comprising:
    identifying a point in the lattice $\Lambda$ that is closest to a received vector;
    obtaining a difference between the identified point and the received vector; and
    approximating a bit likelihood measure using the difference between the identified point and the received vector, wherein approximating includes calculating a sum of probabilities associated with a subset of lattice points within lattice $\Lambda$,
    wherein calculating a sum of probabilities includes summing $P(\tilde{y}+\overline{\lambda}|\overline{S}=\overline{s})$ over the subset of lattice points and a subset of constellation points, where $\tilde{y}$ is the difference between the identified point and the received vector, $\overline{\lambda}$ is a point within the subset of lattice points, and $\bar{s}$ is a possible value of a random transmitted symbol $\bar{S}$.

16. A method for use in processing a received signal in a communication system having a lattice interfered channel, said lattice interfered channel having an associated lattice Λ, comprising:
   identifying a point in the lattice Λ that is closest to a received vector;
   obtaining a difference between the identified point and the received vector; and
   approximating a bit likelihood measure using the difference between the identified point and the received vector, wherein approximating includes calculating a sum of probabilities associated with a subset of lattice points within lattice Λ,
wherein calculating a sum of probabilities includes summing the probability product $P(\tilde{y}+\bar{\lambda}|\bar{S}=\bar{s})P(\bar{\lambda}|\bar{S}=\bar{s})P(\bar{S}=\bar{s})$ over the subset of lattice points, where $\tilde{y}$ is the difference between the identified point and the received vector, $\bar{\lambda}$ is a point within the subset of lattice points, and $\bar{s}$ is a possible value of a random transmitted symbol $\bar{S}$.

17. A method for use in processing a received signal in a communication system having a lattice interfered channel, said lattice interfered channel having an associated lattice Λ, comprising:
   identifying a point in the lattice Λ that is closest to a received vector;
   obtaining a difference between the identified point and the received vector; and
   approximating a bit likelihood measure using the difference between the identified point and the received vector, wherein approximating includes calculating a sum of probabilities associated with a subset of lattice points within lattice Λ,
wherein approximating a bit likelihood measure includes calculating the following bit likelihood approximation:

$$P(b_l=0|\bar{y}) \cong \frac{\sum_{\bar{s}\in\Omega_0(l)}\sum_{\bar{\lambda}\in T(\Lambda)} P(\tilde{y}+\bar{\lambda}|\bar{S}=\bar{s})P(\bar{\lambda}|\bar{S}=\bar{s})P(\bar{S}=\bar{s})}{\sum_{\bar{s}\in\Omega}\sum_{\bar{\lambda}\in T(\Lambda)} P(\tilde{y}+\bar{\lambda}|\bar{S}=\bar{s})P(\bar{\lambda}|\bar{S}=\bar{s})P(\bar{S}=\bar{s})}$$

where $\tilde{y}$ is the difference between the identified point and the received vector, l is a bit position index, Ω represents an encoding-modulation constellation, $\Omega_0(l)$ represents a set of constellation points having zero in the lth bit position, $T(\Lambda)$ is a subset of lattice points within Λ having a norm that is no greater than a predetermined value, and $\bar{S}$ is a random transmitted symbol.

18. A method for use in processing a received signal in a communication system having a lattice interfered channel, said lattice interfered channel having an associated lattice Λ, comprising:
   identifying a point in the lattice Λ that is closest to a received vector;
   obtaining a difference between the identified point and the received vector; and
   approximating a bit likelihood measure using the difference between the identified point and the received vector, wherein approximating includes calculating a sum of probabilities associated with a subset of lattice points within lattice Λ,
wherein approximating a bit likelihood measure includes calculating the following bit likelihood approximation:

$$P(b_l=0|\bar{y}) \cong \frac{\sum_{\bar{s}\in\Omega_0(l)}\sum_{\bar{\lambda}\in T(\Lambda)} P(\tilde{y}+\bar{\lambda}|\bar{S}=\bar{s})}{\sum_{\bar{s}\in\Omega}\sum_{\bar{\lambda}\in T(\Lambda)} P(\tilde{y}+\bar{\lambda}|\bar{S}=\bar{s})}$$

where $\tilde{y}$ is the difference between the identified point and the received vector, l is a bit position index, Ω represents an encoding-modulation constellation, $\Omega_0(l)$ represents a set of constellation points corresponding to zero in the lth bit position, $T(\Lambda)$ is a subset of lattice points within Λ having a norm that is no greater than a predetermined value, and $\bar{S}$ is a random transmitted symbol.

19. A method for processing a communication signal, comprising:
   providing a signal having an error correction codeword component, a translation component, and an additive interference component;
   jointly decoding the error correction codeword component and the translation component of the signal using multilevel code (MLC) decoding to generate a decoded signal; and
   extracting the error correction codeword component from the decoded signal.

20. The method of claim 19 wherein:
providing a signal includes receiving an error correction codeword from a lattice interfered channel.

21. The method of claim 19 wherein:
said translation component includes an MLC translation.

22. The method of claim 19 wherein:
said translation component includes a lattice code translation.

23. The method of claim 19 wherein:
   said error correction codeword component of the signal includes a codeword of a corresponding error correction code; and
   said translation component of the signal includes a translation associated with a lattice code; and
   said error correction code and said lattice code collectively form an MLC.

24. The method of claim 19 wherein:
   said error correction codeword component of the signal includes a codeword of a corresponding error correction code; and
   said translation component of the signal includes a translation associated with a first MLC; and
   said error correction code and said first MLC collectively form a second MLC.

25. A receiver comprising:
   a multilevel code (MLC) decoder to jointly decode an error correction code component and a translation component of a received signal to generate a decoded signal; and
   an ECC extraction unit to extract the error correction code component from the decoded signal.

26. The receiver of claim 25 wherein:
said MLC decoder uses iterative decoding techniques.

27. The receiver of claim 25 wherein:
said translation component of said received signal includes an MLC translation.

28. The receiver of claim 25 wherein:
said translation component of said received signal includes a lattice code translation.

29. The receiver of claim 25 wherein:

said error correction code component and said translation component together form a code point of an MLC.

30. A communication device comprising:

a transmitter to generate transmit signals for delivery to a remote receiver through a lattice interfered channel, said transmitter including an error correction encoder to encode input data according to an error correction code, wherein said error correction code is selected so that a multilevel code is formed by the collective action of the error correction coder and the lattice interfered channel during transmitter operation, wherein the error correction encoder includes a modulator to map the encoded input data into a signal constellation having more than $2^k$ signal points in k dimensions for transmission through the lattice interfered channel at a rate of no greater than 0.7 bits/dimension.

31. The communication device of claim 30, wherein:

said transmitter includes a modulo lattice unit to perform a modulo lattice operation on a signal, said modulo lattice unit forming a part of the lattice interfered channel.

32. The communication device of claim 30, wherein:

the remote receiver includes a modulo lattice unit to perform a modulo lattice operation on a signal, said modulo lattice unit forming a part of the lattice interfered channel.

* * * * *

UNITED STATES PATENT AND TRADEMARK OFFICE
CERTIFICATE OF CORRECTION

PATENT NO. : 7,036,071 B2  Page 1 of 1
APPLICATION NO. : 10/214630
DATED : April 25, 2006
INVENTOR(S) : Shany et al.

It is certified that error appears in the above-identified patent and that said Letters Patent is hereby corrected as shown below:

On the TITLE page, in field (56), under "Other Publications", in column 2, line 4, after "Comm." insert -- , --.

In column 10, line 65, in Claim 15, delete "$P(\tilde{y}+\tilde{\lambda}\tilde{S}=\tilde{s})$" and insert -- $P(\tilde{y}+\tilde{\lambda}|\tilde{S}=\tilde{s})$ --, therefor.

In column 10, line 66, in Claim 15, delete "$\hat{y}$" and insert -- $\tilde{\tilde{y}}$ --, therefor.

In column 11, line 17, in Claim 16, delete "$P(\hat{y}+\tilde{\lambda}|\tilde{S}=\tilde{s})$" and insert -- $P(\tilde{y}+\tilde{\lambda}|\tilde{S}=\tilde{s})$ --, therefor.

In column 11, line 18, in Claim 16, delete "$\hat{y}$" and insert -- $\tilde{\tilde{y}}$ --, therefor.

In column 11, line 45, in Claim 17, delete "$\hat{y}$" and insert -- $\tilde{\tilde{y}}$ --, therefor.

In column 12, line 9, in Claim 18, delete "$\hat{y}$" and insert -- $\tilde{\tilde{y}}$ --, therefor.

Signed and Sealed this

Twenty-eighth Day of November, 2006

JON W. DUDAS
*Director of the United States Patent and Trademark Office*